United States Patent
Agoston et al.

(10) Patent No.: US 7,612,628 B2
(45) Date of Patent: Nov. 3, 2009

(54) ULTRAFAST SAMPLER WITH COAXIAL TRANSITION

(75) Inventors: Agoston Agoston, Beaverton, OR (US); John Ebner, Portland, OR (US); Steven Pepper, Portland, OR (US); Robert Norton, Beaverton, OR (US)

(73) Assignee: Picosecond Pulse Labs, Beaverton, OR (US)

( * ) Notice: Subject to any disclaimer, the term of this patent is extended or adjusted under 35 U.S.C. 154(b) by 396 days.

(21) Appl. No.: 11/238,592

(22) Filed: Sep. 28, 2005

(65) Prior Publication Data

US 2006/0038551 A1    Feb. 23, 2006

Related U.S. Application Data

(62) Division of application No. 09/833,015, filed on Apr. 10, 2001, now Pat. No. 7,084,716.

(51) Int. Cl.
*H04B 3/04* (2006.01)

(52) U.S. Cl. .......................... 333/20; 333/137; 333/251; 333/135

(58) Field of Classification Search ................... 333/20, 333/251, 135, 137
See application file for complete search history.

(56) References Cited

U.S. PATENT DOCUMENTS 3,278,763 A    10/1966 Grove
3,629,731 A    12/1971 Frye (Continued)

FOREIGN PATENT DOCUMENTS

EP    0320175 A2    12/1988

(Continued)

OTHER PUBLICATIONS

M. Rodwell, "GaAs Nonlinear Transmission Lines for Picosecond Pulse Generation and Millimeter-Wave Sampling," *IEEE Trans. Microwave Theory Tech.*, 7:1194-1204 (Jul. 1991).

(Continued)

*Primary Examiner*—Patricia Nguyen
(74) *Attorney, Agent, or Firm*—Klarquist Sparkman, LLP

(57) ABSTRACT

An ultrafast sampler includes a series of Schottky diodes configured with a coplanar waveguide to form a nonlinear transmission line (NLTL) that compresses a local oscillator input to form a series of strobe pulses. Strobe pulses of opposite polarity are capacitively coupled to sampling diodes to obtain samples of a signal applied to a signal input. The samples are directed along an intermediate frequency waveguide to, for example, a signal processor such as an oscilloscope, for storage and analysis. The intermediate frequency waveguide is configured so that conductors of the intermediate frequency waveguide receive signal samples of a common polarity and strobe samples of opposite polarities so that portions of strobe pulses delivered to a signal processor are distinguished from signal samples. In an embodiment, the intermediate frequency waveguide and the strobe waveguide are symmetrically situated along a common axis, and conductors of the strobe waveguide are positioned between the axis and the conductors of the intermediate frequency waveguide. The sampling circuit is defined on a GaAs substrate and a coaxial-to-airline-to-substrate transition is configured to deliver signals from a coaxial cable to the sampling circuit. A signal output is configured to direct the signal back into a coaxial cable.

16 Claims, 7 Drawing Sheets

U.S. PATENT DOCUMENTS

| | | | |
|---|---|---|---|
| 3,760,283 A | 9/1973 | Lockwood | |
| 3,768,025 A | 10/1973 | Hreha | |
| 3,909,751 A | 9/1975 | Tang et al. | |
| 4,051,450 A | 9/1977 | Barlow | |
| 4,075,650 A | 2/1978 | Calviello | |
| 4,473,807 A | 9/1984 | Weber et al. | |
| 4,487,999 A | 12/1984 | Baird et al. | |
| 4,594,557 A | 6/1986 | Shillady | |
| 4,654,600 A | 3/1987 | Lockwood | |
| 4,734,576 A * | 3/1988 | Agoston et al. | 250/225 |
| 4,745,445 A | 5/1988 | Mun et al. | |
| 4,750,666 A | 6/1988 | Neugebauer et al. | |
| 4,855,696 A | 8/1989 | Tan et al. | |
| 4,910,458 A | 3/1990 | Forsyth et al. | |
| 4,931,753 A | 6/1990 | Nelson et al. | |
| 4,956,568 A | 9/1990 | Su et al. | |
| 5,014,018 A | 5/1991 | Rodwell et al. | |
| 5,105,536 A | 4/1992 | Neugebauer et al. | |
| 5,157,361 A | 10/1992 | Gruchalla et al. | |
| 5,256,996 A | 10/1993 | Marsland et al. | |
| 5,267,020 A | 11/1993 | Marsland et al. | |
| 5,267,200 A | 11/1993 | Tobita | |
| 5,378,939 A | 1/1995 | Marsland et al. | |
| 5,479,120 A | 12/1995 | McEwan | |
| 5,506,513 A | 4/1996 | Bacher | |
| 5,519,342 A * | 5/1996 | McEwan | 327/94 |
| 5,679,006 A | 10/1997 | Madelaine | |
| 5,789,994 A | 8/1998 | Case et al. | |
| 5,952,727 A | 9/1999 | Takano et al. | |
| 5,956,568 A | 9/1999 | Shiralagi et al. | |
| 6,060,915 A | 5/2000 | McEwan | |
| 6,097,263 A | 8/2000 | Mueller et al. | |
| 6,160,312 A | 12/2000 | Raad | |
| 6,242,899 B1 | 6/2001 | Miller | |
| 6,429,822 B1 | 8/2002 | Naudin et al. | |
| 6,611,237 B2 | 8/2003 | Smith | |
| 6,628,849 B2 | 9/2003 | Yap et al. | |
| 6,670,928 B1 | 12/2003 | Chekroun et al. | |
| 6,690,247 B2 | 2/2004 | Kintis et al. | |
| 6,826,208 B1 | 11/2004 | Birk | |
| 6,867,668 B1 | 3/2005 | Dagostino et al. | |
| 6,900,710 B2 | 5/2005 | Agoston et al. | |
| 7,193,486 B2 | 3/2007 | Mrozek et al. | |
| 7,462,956 B2 | 12/2008 | Lan et al. | |
| 2002/0130734 A1 | 9/2002 | Liang et al. | |
| 2002/0145484 A1 | 10/2002 | Agoston et al. | |
| 2002/0167373 A1 | 11/2002 | Agoston et al. | |
| 2004/0039283 A1 | 2/2004 | Banjanin et al. | |

FOREIGN PATENT DOCUMENTS

| | | |
|---|---|---|
| EP | 0453744 A1 | 3/1991 |
| EP | 0753890 A2 | 1/1997 |
| GB | 2280988 | 2/1995 |

OTHER PUBLICATIONS

Boivin et al., "Receiver Sensitivity Improvement by Impulsive Coding," *IEEE Photonics Technology Letters* 9:684-686 (May 1997).

R. Levy, "New Coaxial-to-Stripline Transformers Using Rectangular Lines," *IEEE Trans. Microwave Theory Tech.*, MTT-9:273-274 (May 1961).

W.M. Grove, "Sampling for Oscilloscopes and Other RF Systems: Dc Through X-Band," *IEEE Transactions on Microwave Theory and Techniques* MTT-14:629-635 (Dec. 1966).

Merkelo et al., "Broad-Band Thin-Film Signal Sampler," *IEEE J. of Solid-State Circuits* SC-7:50-54 (Feb. 1972).

Pullela et al., "Multiplexer/Demultiplexer IC Technology for 100 Gb/s Fiber-Optic Transmission," *IEEE J. of Solid State Circuits* (Mar. 1996).

Whiteley et al., "50 GHz Sampler Hybrid Utilizing a Small Shockline and an Internal SRD," *IEEE MTT-S Digest* AA-6:895-898 (1991).

S. Allen, "Schottky Diode Integrated Circuits for Sub-Millimeter-Wave Applications," University of California (Jun. 28, 1994).

M. Case, "Nonlinear Transmission Lines for Picosecond Pulse, Impulse and Millmeter-Wave Harmonic Generation," University of California (Jul. 2, 1993).

S.T. Allen et al., "72 GHz Sampling Circuits Integrated with Nonlinear Transmission Lines," IEEE Device Research Conference (1994).

Van Der Weide, "A YIG-tuned nonlinear transmission line multiplier," *IEEE MTT-S Digest* 2:557-560 (1993).

Office Action from the United States Patent & Trademark office in co-pending U.S. Appl. No. 11/442,499, dated Jun. 27, 2008.

Office Action from the United States Patent & Trademark office in co-pending U.S. Appl. No. 11/442,499, dated Feb. 5, 2009.

Office Action from the United States Patent & Trademark office in co-pending U.S. Appl. No. 11/442,499, dated Apr. 2, 2009.

Written Opinion of the International Searching Authority, dated Dec. 27, 2005, for corresponding International Application No. PCT/US2005/027586, filed Aug. 1, 2005.

Written Opinion of the International Searching Authority dated Dec. 3, 2007, for corresponding International Application No. PCT/US2007/012455, International Filing Date May 25, 2007.

International Search Report, for corresponding International Application No. PCT/US2007/012455, International Filing Date May 25, 2007.

* cited by examiner

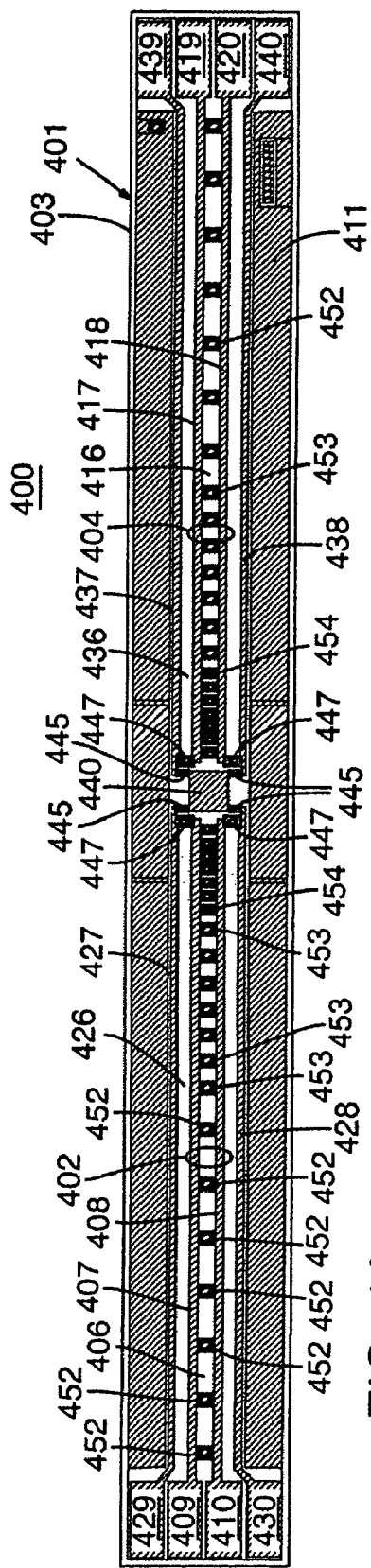
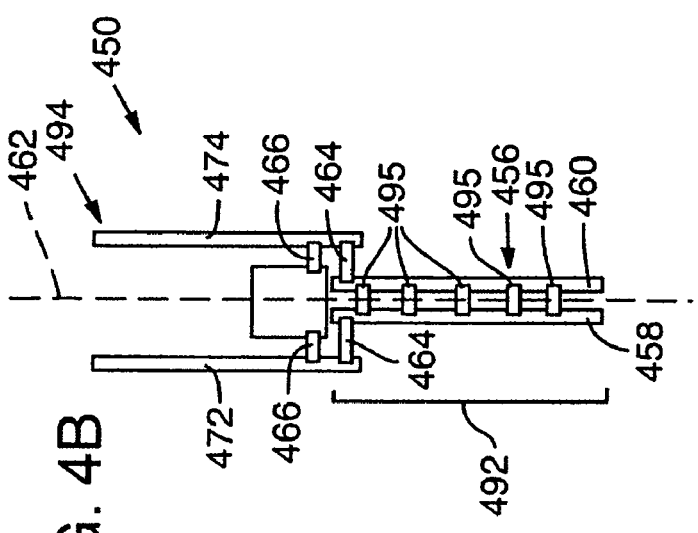
FIG. 4A
FIG. 4B

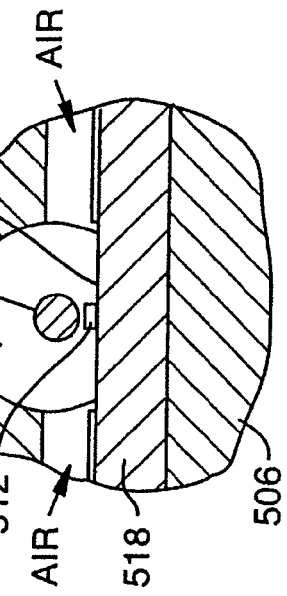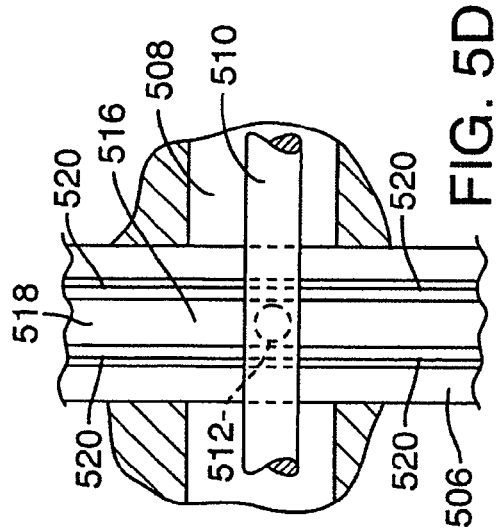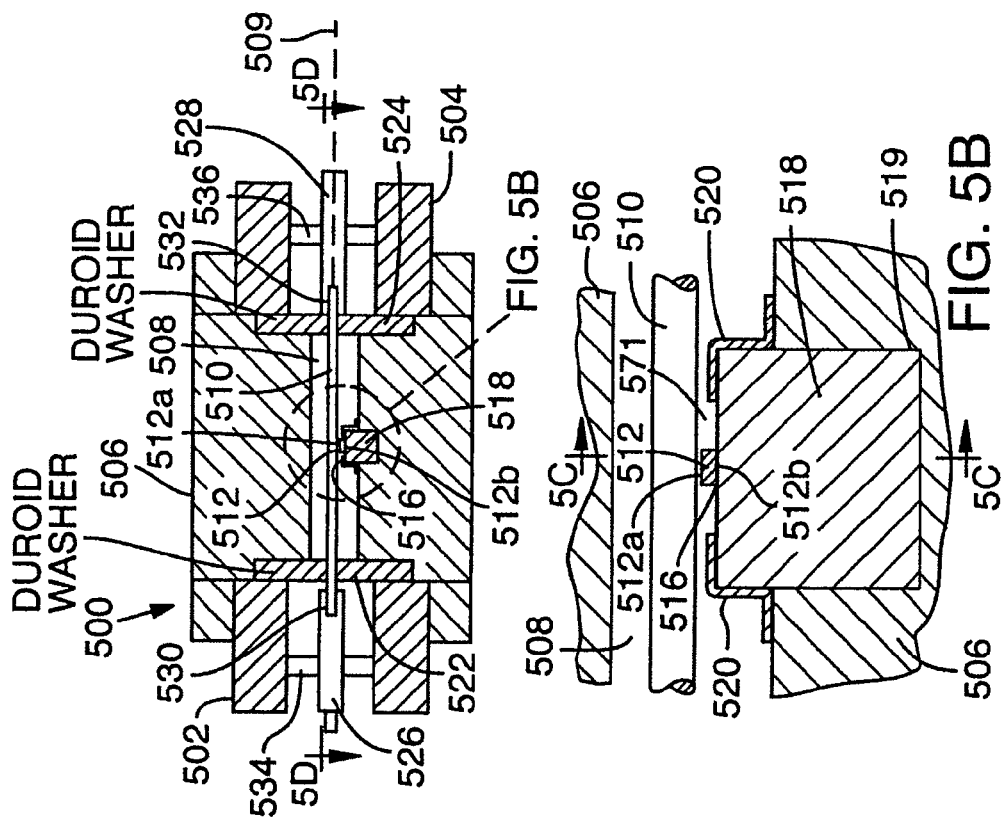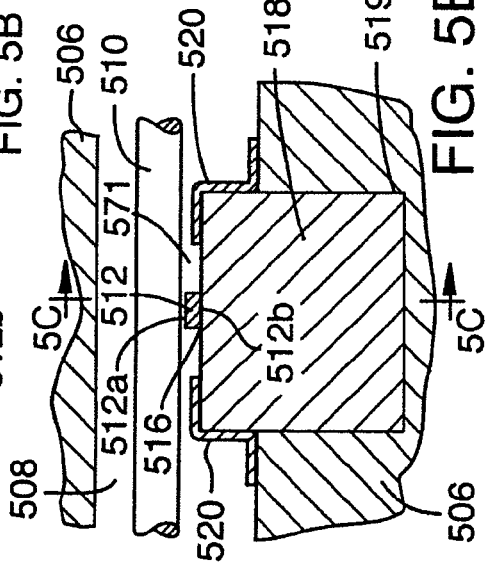
FIG. 5C
FIG. 5D
FIG. 5A
FIG. 5B

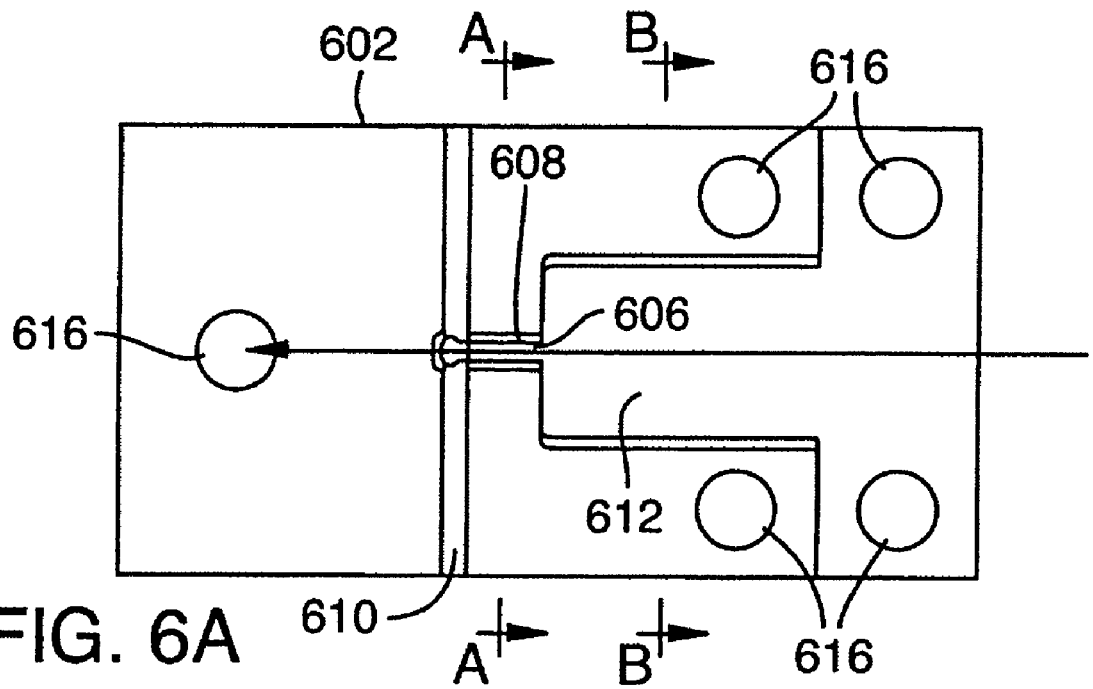
FIG. 6A
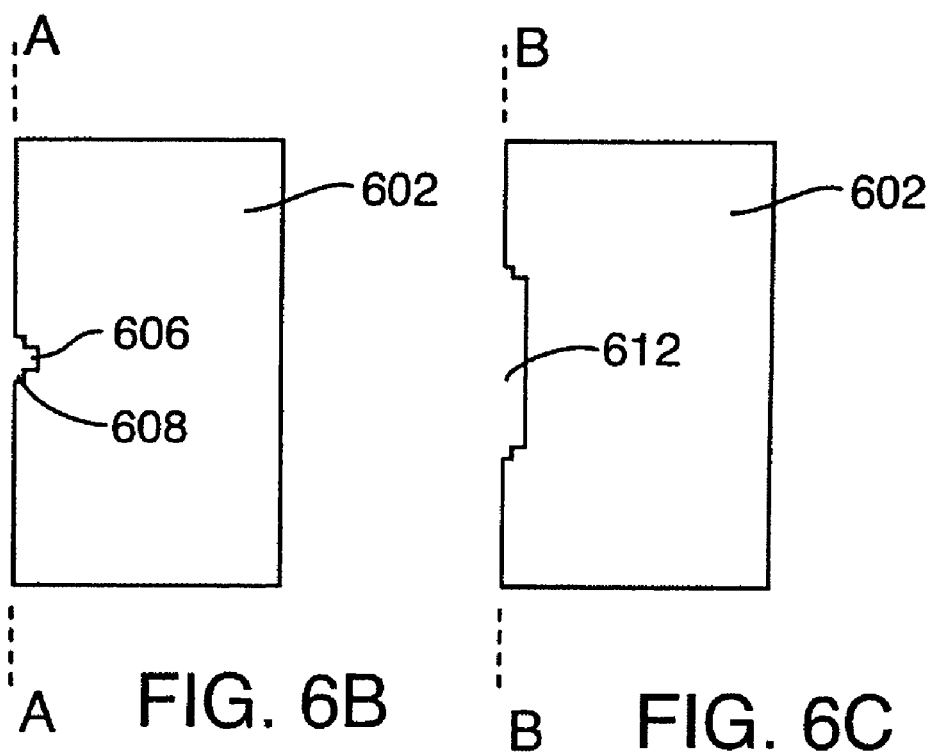
FIG. 6B
FIG. 6C

ULTRAFAST SAMPLER WITH COAXIAL TRANSITION

RELATED APPLICATIONS

This application is a division of application Ser. No. 09/833,015, filed Apr. 10, 2001 now U.S. Pat. No. 7,084,716.

FIELD OF THE INVENTION

The invention pertains to methods and apparatus for high speed electrical sampling.

BACKGROUND

The measurement of high speed electrical signals can be performed by sampling the signals at a series of time delays and then plotting signal amplitudes as a function of time. So-called "real time" digitizers typically have sampling rates no greater than about 1-2 Gsample/sec so that electrical signals having frequency components at frequencies greater than a few GHz must be characterized using so-called "equivalent time" sampling. In equivalent time sampling, a periodic input signal is sampled at a rate that is much less than the highest frequency component of the input signal over many repetitions of the input signal and the measurements are assembled to provide an estimate of the input signal during a single period. Equivalent time sampling is described in, for example, Marsland et al., U.S. Pat. No. 5,378,939 ("Marsland") which is incorporated herein by reference.

For measurement of very high bandwidth electrical signals, equivalent time sampling systems typically attempt to provide a short duration "strobe pulse" to one or more sampling diodes. The sampling diodes are switched by the strobe pulse, and then a portion (i.e., a sample) of the input signal is communicated to a signal acquisition system. The duration and magnitude of the sample is determined by one or more temporal properties of the strobe pulse, such as rise time, fall time, or duration. Accordingly, for high speed electrical signals, the strobe pulse should have a short rise time, fall time, or duration. Examples of sampling systems and strobe pulse generators for such sampling systems are described in, for example, Marsland, Rodwell et al., U.S. Pat. No. 5,014,108, McEwan, U.S. Pat. No. 6,060,915, Lockwood, U.S. Pat. No. 4,654,600, Lockwood, U.S. Pat. No. 3,760,283, Frye, U.S. Pat. No. 3,629,731, W. M. Grove, "Sampling for oscilloscopes and other RF Systems: Dc through X-band," IEEE Trans. Microwave Theory and Technique MTT 14:629-635 (1966), and W. C. Whitely et al., "50 GHz sampler hybrid utilizing a small shockline and an internal SRD," IEEE MTT-S Digest (1991), which are incorporated herein by reference.

While a fast strobe pulse is needed for such a sampling system, it is also desirable that the connection of an input signal to the sampling system neither introduce signal artifacts nor disturb the signal under test. Sampling systems establish a sample window by switching a sampling diode between conducting and non-conducting states with a fast strobe pulse, and typically a portion of the strobe pulse is transmitted to the device under test. This portion is referred to as "strobe kickout." In addition, a portion of the signal to be measured is typically transmitted around one or more sampling diodes and detected even with the sampling gate closed. This signal portion is referred to as "blowby." It will be apparent that signal artifacts caused by strobe kickout and blowby are preferably avoided. Other signal artifacts are caused by the connection of the sampling system to the signal to be measured. For example, the propagation of high speed electrical signals depends on the waveguide properties of cables and transmission lines on which the electrical signals propagate, and the connection of a sampling system to a cable or a waveguide generally loads the waveguide or presents an unmatched impedance. As a result, electrical signals arriving at the connection are partially reflected and these reflections can appear as artifacts in the measurement of the signal or can be transmitted to the signal source, thereby changing the signal presented to the sampling system. In some prior art systems, signal artifacts are introduced by connection of the sampling system to a device to be tested so that measurements are corrupted by the connection.

In addition to the problems listed above, the temporal resolution of sampling systems can be limited by strobe pulse duration, strobe pulse rise or fall times, or difficulties in transmitting a strobe pulse to a sampling gate without degradation. Other sampling systems permit sampling only at relatively low sampling rates so that signal acquisition requires measurements over many signal periods. With such systems, because only a small fraction of a signal is measured, data acquisition is slow and random noise in measurements cannot be efficiently reduced by signal averaging.

In view of these and other shortcomings, improved sampling methods, sampling apparatus, as well as methods and apparatus for connecting signal sources to sampling systems are needed.

SUMMARY

Airline transitions are provided for delivering an electrical signal propagating on a waveguide or cable, such as a coaxial cable to a substrate. The transitions include one or more adapters configured to retain the cable or waveguide and deliver the electrical signal to an airline conductor that is situated along or approximately parallel to an axis of a bore or similar cavity in a conductive housing. In representative embodiments, the conductive housing is configured to retain a substrate that is provided with an interconnect that extends into the cavity and electrically contacts the airline conductor. In other representative embodiments, the cavity has a circular cross section and the airline conductor is situated along the axis of the cavity. According to particular embodiments, the interconnect is a conductive puck that can include one or more bond balls formed by, for example, a wire bonding process.

Sampling systems are provided that include airline transitions that are configured to deliver an electrical signal to a substrate that includes a sampling circuit. The sampling circuit includes a strobe waveguide, an intermediate frequency ("IF") waveguide, and a signal input. The strobe waveguide is provided with one or more Schottky diodes, varactors, or hyperabrupt diodes configured to form a nonlinear transmission line ("NLTL") or shockline. The NLTL is configured to produce strobe pulses in response to a local oscillator input. The NLTL is in electrical communication with one or more sampling diodes that switchably communicates portions of a signal applied to the signal input to the IF waveguide. The NLTL provides substantially symmetric strobe pulses but of opposite polarity to corresponding sampling diodes, and input signal portions of a common polarity are delivered to respective conductors of the IF waveguide as selected by application of the strobe pulses to the sampling diodes. In addition, strobe pulse portions of opposite polarity are delivered to the respective conductors of the IF waveguide. The IF waveguide is configured to communicate the signal portions and the strobe portions to a signal processor. Because the signal portions have a common polarity and the strobe portions have opposite polarities, the signal processor can recover signal samples by, for example, summing signals obtained from the IF waveguide conductors.

Sampling circuits are provided that include two sampling diodes, a strobe waveguide, and an intermediate frequency waveguide. The strobe waveguide is configured to provide a local oscillator signal (such as a series of one or more strobe pulses) to the sampling diodes to produce signal samples that are directed to the intermediate frequency waveguide. The waveguides are configured so that the local oscillator signal and the strobe signal propagate in different waveguide modes. In some embodiments, the local oscillator signal propagates as an odd mode and the signal samples propagate as an even mode on the strobe waveguide and the intermediate frequency waveguide, respectively. According to additional embodiments, the strobe waveguide and the intermediate frequency waveguide are approximately symmetrically placed with respect to a common axis.

Sampling methods are provided in which sampling gates such as sampling diodes are controlled with a strobe signal. The strobe signal is propagated as a strobe mode along a strobe waveguide. Samples of an input signal are directed to an intermediate frequency waveguide and propagated in a sample mode on the intermediate frequency waveguide, wherein the strobe mode and the sample mode are different. In particular examples, the strobe mode is an odd mode of the strobe waveguide and the sample mode is an even mode of the intermediate frequency waveguide.

These and other features and advantages of the invention are set forth below with reference to the accompanying drawings.

BRIEF DESCRIPTION OF THE DRAWINGS

FIG. 4A is a schematic plan view of a sampling circuit that includes two nonlinear transmission lines.

FIG. 4B is a partial schematic plan view of another representative embodiment of a sampling circuit defined as a substrate.

FIGS. 5A-5D are a sectional views of a coaxial airline to substrate transition.

FIG. 6A is a plan view of a substrate portion of a housing for a coaxial airline to substrate transition.

FIGS. 6B-6C are sectional views of the substrate portion of FIG. 6A.

DETAILED DESCRIPTION

Figure 1:
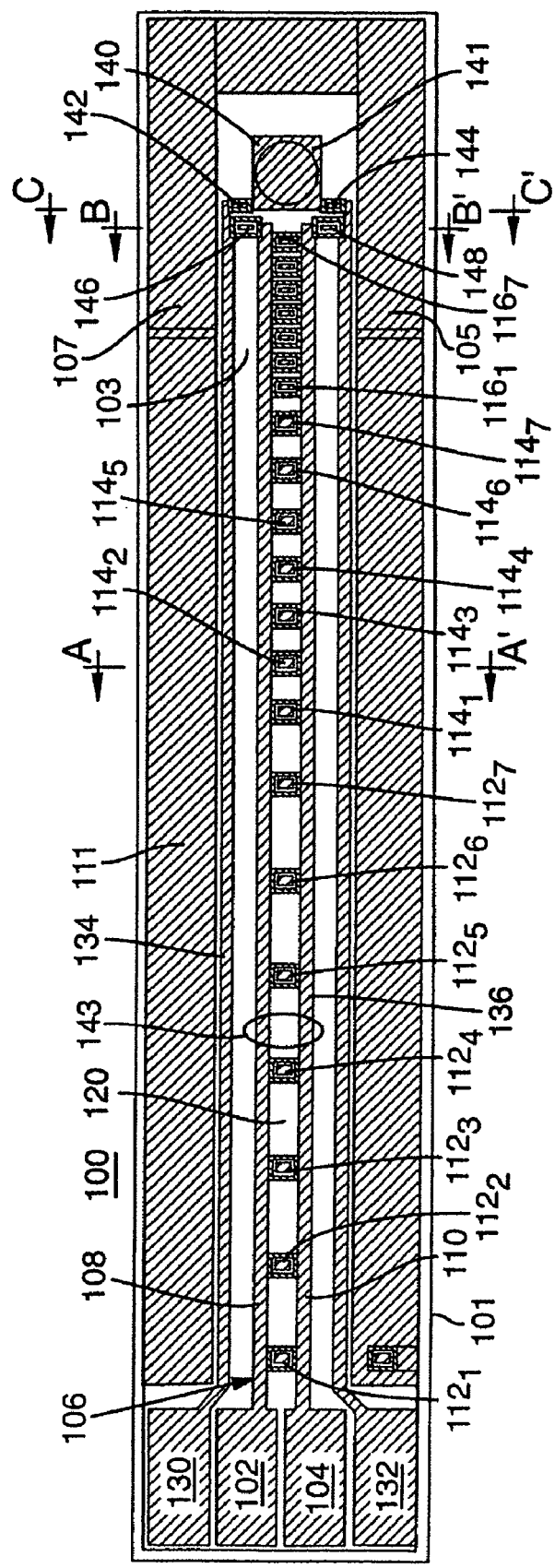
FIG. 1 is a schematic plan view of a sampling circuit that is defined on a substrate and that includes a nonlinear transmission line.

With reference to FIG. 1, a sampling circuit 100 is formed on a substrate 101 and includes local oscillator (LO) inputs 102, 104 in communication with a coplanar strip waveguide ("strobe waveguide") 106 that is defined by conductors 108, 110. A ground conductor 111 extends around a portion of a perimeter of the sampling circuit 100 and is electrically connected to a ground plane defined by a conductive layer on an opposing surface (not shown in FIG. 1) of the substrate 101 with bond wires or other connection method. A conductive strap 103 connects portions 105, 107 of a ground conductor 111. Diodes $112_J$, J=1, ..., 7, diodes $114_J$, J=1, ..., 7, and diodes $116_J$, J=1, ..., 7 (referred to herein collectively as diodes 112, 114, 117) electrically connect the conductor 108 to the conductor 110. In the example of FIG. 1, the diodes 112, 114, 116 are separated longitudinally along a waveguide axis by 120 by respective distances of about 0.125 mm, 0.075 mm, and 0.030 mm and have respective capacitances of 270 fF, 90 fF, and 45 fF. As shown in the embodiment of FIG. 1, a total of 21 diodes interconnect the conductors 108, 110. In additional embodiments, more or fewer diodes can be used, and the diode spacings and/or capacitances can be varied. The sampling circuit 100 of FIG. 1 is conveniently defined on a GaAs substrate having dimensions of about 2.165 mm by 0.400 mm by 0.4 mm.

Intermediate frequency ("IF") outputs 130, 132 (also referred to herein as sample outputs) are situated at ends of conductors 134, 136, respectively. The conductors 134, 136 are configured to form a waveguide ("intermediate frequency waveguide") 138 and are connected to a conductive input pad 140 by respective sampling diodes 142, 144. In a representative example, the sampling diodes 142, 144 have capacitances of about 8 fF. Diodes 146, 148 are provided that electrically connect the conductors 134, 136 of the IF waveguide 138 to conductors 108, 110, respectively, of the strobe waveguide 106. The capacitances of the diodes 146, 148 are about 45 fF in the example of FIG. 1. The input pad 140 is provided with a compliant input connection 141 such as a thin disc of gold, or one or more wire bond balls that can be attached by a conventional wirebonding followed by bond wire removal.

The strobe waveguide 106 and the diodes 112, 114, 116 are configured as a nonlinear transmission line ("NLTL" or "shockline") 143 to shape a local oscillator ("LO") signal received at the LO inputs 102, 104 and produce a strobe signal at the diodes 146, 148 and the sampling diodes 142, 144. Because the properties of the diodes 112, 114, 116 are nonlinear functions of applied voltage, the strobe signal can have a duration, a rise time, or a fall time that is less than the corresponding temporal characteristic of the LO signal at the LO inputs 102, 104. Typically, the diodes 112, 114, 116 are arranged to produce a strobe signal having a rise time that is shorter than a rise time of the LO signal. As used herein, rise time generally refers to a time duration in which an electrical signal makes a transition from about 10% of a maximum value to about 90% of the maximum value, wherein the maximum value is an absolute value of applied voltage. In addition, in the embodiment of FIG. 1, diodes 112, 114, 116 are used as nonlinear elements in the NLTL 143, but other nonlinear devices can be used. For example, devices having capacitances that are functions of applied voltage such as varactors and hyperabrupt diodes can be used.

The conductors 108, 110, 111, 134, 136, the outputs 130, 132, and the inputs 102, 104 are formed by a thin conductive layer that is patterned. For example, a thin layer of gold or other metal can be used, and additional metallic or other layers can be formed on the gold layer or on the substrate 101 prior to formation of the gold layer for various purposes, such as, for example, to protect the gold layer or to promote bonding the gold layer to the substrate 101. In addition, one or more layers can be formed between such a conductive layer and the substrate 101, to, for example, promote adhesion of the gold layer to the substrate or to reduce migration of contaminants from the gold layer into the substrate. Patterning of a conductive layer can be accomplished using photolithographic or other methods.

In the embodiment of FIG. 1, the conductors 108, 110 are situated symmetrically with respect to the waveguide axis 120. The conductors 134, 136 of the IF waveguide are symmetrically configured with respect to, and more distant from, the waveguide axis 120.

Figure 2A:
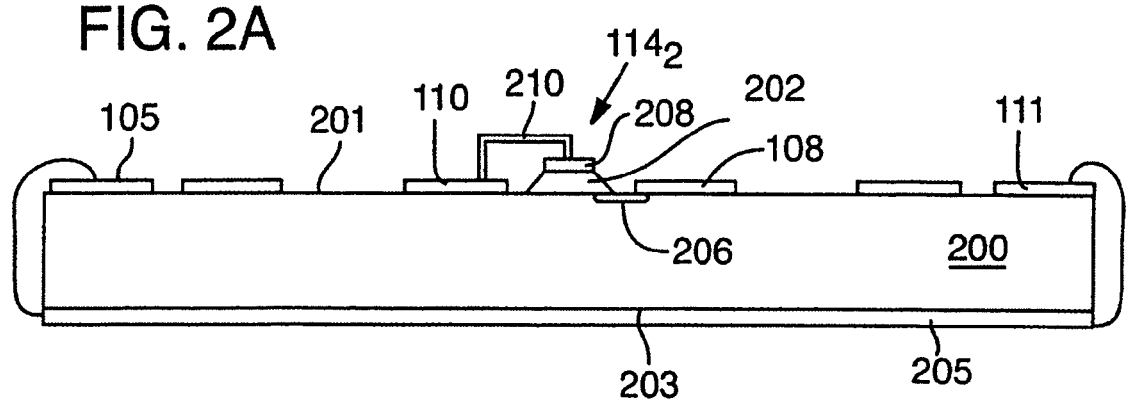
FIGS. 2A-2C are schematic sectional views of the sampling circuit of FIG. 1.
Figure 2B:
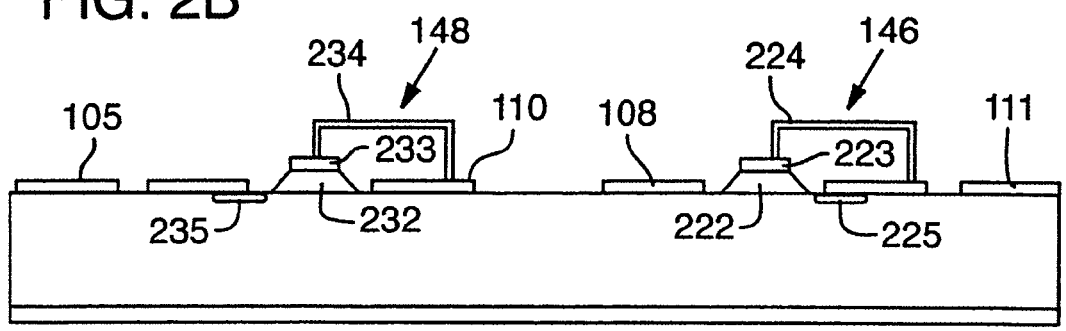
Figure 2C:
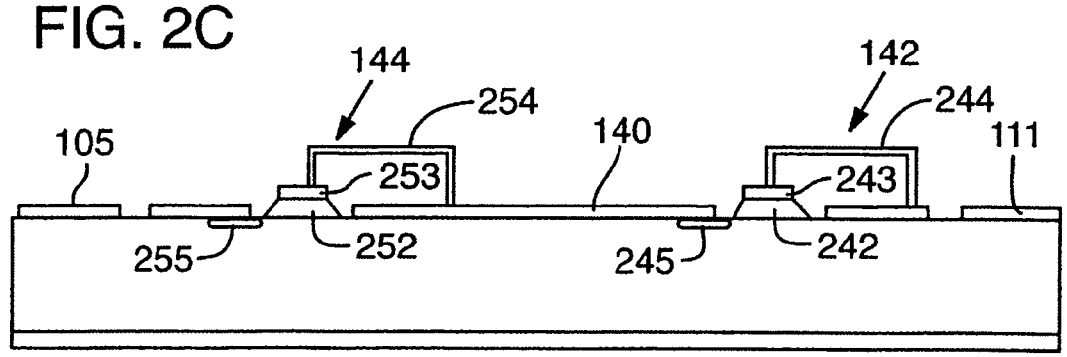

FIGS. 2A-2C are schematic sectional views of the sampling circuit 100 of FIG. 1. With reference to FIG. 2A, the diode $114_2$ includes an N− doped GaAs mesa 202 that is defined on a surface 201 of an N+ doped GaAs substrate 200. A ground plane conductor 203 substantially covers an opposing surface 205. An ohmic contact 206 electrically connects the conductor 108 to the mesa 202 and a Schottky junction is formed between a Schottky metal layer 208 and the mesa 202. The conductor 110 is electrically connected to the metal layer 208 with an airbridge 210. Typically the mesa 202 and other features of the sampling circuit 100 are photolithographically defined. Additional features of the diode 1142 such as layers applied for passivation or to promote adhesion are not shown in FIG. 2A. Other diodes of the NLTL are similar. Ground straps 211 electrically connect the conductors 105, 111 to the ground plane conductor 203.

FIG. 2B illustrates the configuration of the diodes 146, 148. The diodes 146, 149 are defined by respective mesas 222, 232, Schottky metal layers 223, 233, airbridges 224, 234, and ohmic contact regions 225, 235. The sampling diodes 142, 144 are illustrated in FIG. 2C and are defined by respective mesas 242, 252, Schottky metal layers 243, 253, airbridges 244, 254, and ohmic contact regions 245, 255.

The diodes 112, 114, 116 and the strobe waveguide 106 form the NLTL 143. In other embodiments, different combinations of diodes can be used. For example, diodes of two or more different sizes can be arranged along the strobe waveguide 106. In other embodiments, diode size can taper gradually along the strobe waveguide 106 so that no two diodes have identical design dimensions.

The strobe waveguide 106 and the IF waveguide 138 are configured to be approximately symmetric with respect to an axis 120. In additional embodiments, the conductors 106, 108, 134, 136 are not symmetrically configured. As shown in FIG. 1, the strobe waveguide 106 and the IF waveguide 138 are similar to coplanar stripline ("CPS") waveguides having a lateral groundplane. Properties of such waveguides are described in, for example, K. C. Gupta et al., *Microstrip Lines and Slotlines* (1996), which is incorporated herein by reference.

Figure 3:
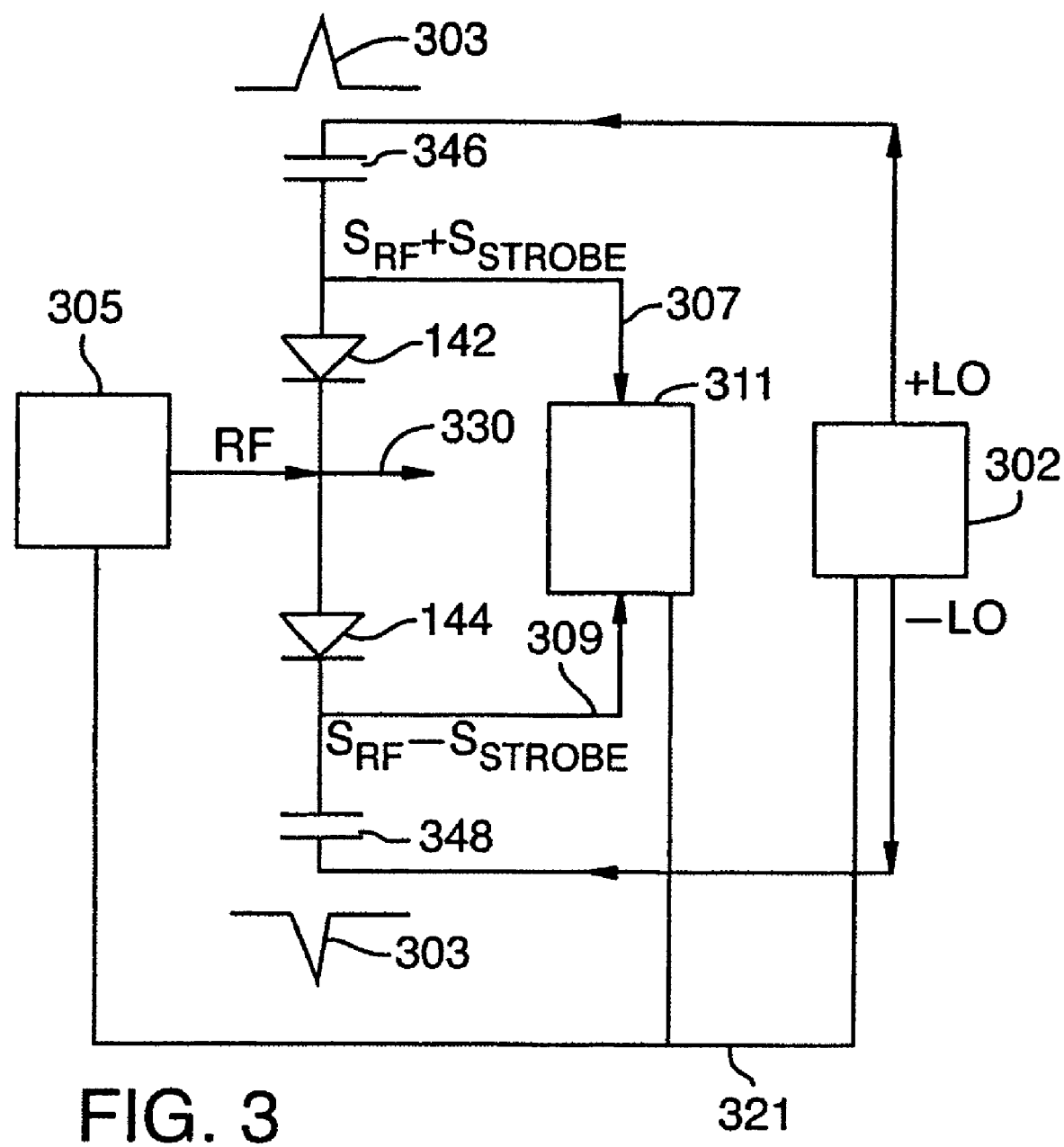
FIG. 3 is a block diagram that includes an electrical schematic diagram corresponding to the sampling circuit of FIG. 1.
Figure 6D:
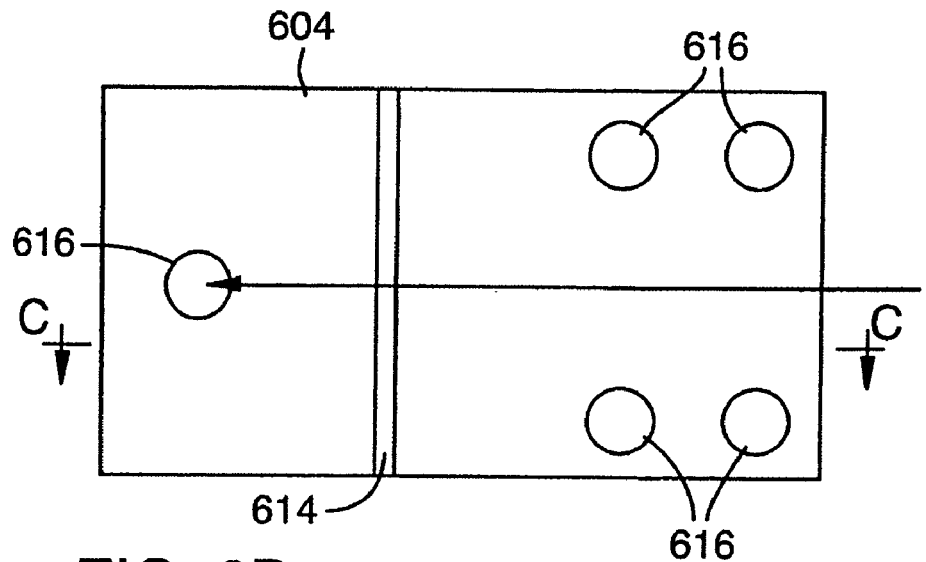
FIG. 6D is a plan view of a lid portion of a housing for a coaxial airline to substrate transition.
Figure 6E:
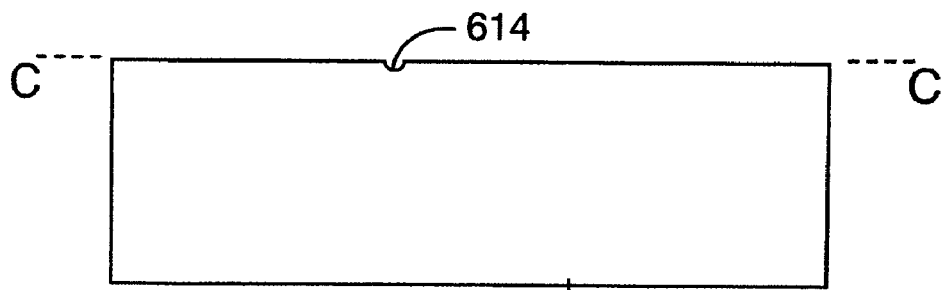
FIG. 6E is a sectional view of the lid portion of FIG. 6D.

The operation of the sampling circuit 100 can be conveniently described with reference to FIG. 3 that includes a block diagram and electrical schematic diagram corresponding to a portion of the sampling circuit 100. An LO signal is provided by an LO source 302 and can be, for example, a 10 GHz sinusoidal voltage of amplitude of about 1 V, or other electrical signal, produced with, for example, one or more step recovery diodes or other devices. The LO signal propagates along the NLTL 143 and is shaped by the diodes 112, 114, and 116 to produce a series of approximately symmetric sampling pulses 303 of duration of about 3.5 ps or less. As shown in FIG. 3, the sampling pulses 303 delivered to the capacitors 346, 348 are similar but are of opposite polarity. The sampling pulses 303 are communicated to the sampling diodes 142, 144 via the diodes 146, 148, shown in FIG. 3 as capacitors 346, 348, respectively. The sampling pulses 303 control the sampling diodes 142, 144 so that an electrical signal ("RF signal") from a signal source 305 is communicated to the IF waveguide 138, represented in FIG. 3 as IF outputs 307, 309. In some embodiments, a signal output 330 is also provided. The portion of the electrical signal that is communicated to the IF outputs 307, 309 (i.e., the IF waveguide 138) is referred to herein as the "sampled RF" ($S_{RF}$) and depends on the duration, pulse shape, and amplitude of the sampling pulses and the temporal response of the sampling diodes 142, 144 as well as relative timing between the sampling pulses 303 and the RF signal. Portions of the strobe pulses 303 are also communicated to the IF outputs 307, 309 and are referred to herein as "strobe outputs" ($S_{STROBE}$). As illustrated in FIG. 3, the sampled RF communicated to each of the IF outputs 307, 309 is similar but the strobe outputs communicated to the IF outputs 307, 309 have opposite polarity. Thus, the signals propagating at the IF outputs 307, 309 correspond to $S_{RF}+S_{STROBE}$ and $S_{RF}-S_{STROBE}$. Accordingly, the sampled RF can be distinguished from the strobe outputs, by, for example, summing these signals. Typically the combined sampled RF and the strobe outputs are delivered to a signal processor 311 such as a digitizer, oscilloscope, or other data storage and processing apparatus. While not shown in FIG. 3, the combined sampled RF and strobe outputs can be filtered, amplified, buffered, summed, or otherwise processed and delivered as processed to the signal processor 311.

As noted above, the length of the time interval during which the RF signal is communicated to the IF outputs 307, 309 depends on the characteristics of the sampling pulses 303 and the sampling diodes 142, 144 as well as other factors. The sampled RF can also be controlled by adjustment of a bias applied to the sampling diodes 142, 144. For example, the signal processor 311 can include a bias source that applies a bias voltage to the sampling diodes 142, 146. Alternatively, an additional signal source can be provided to produce a bias voltage. The magnitude and sign of the bias voltage can be selected so that the sampling diodes 142, 146 do not impede communicate of any portion of the RF signal to the IF outputs 307, 308 or so that small amplitude RF signals are communicated efficiently to the IF outputs 307, 309. The bias voltage can be communicated on the IF waveguide 138, and can include frequency components at frequencies at least as high as permitted by the frequency response of the IF waveguide 138. Adjustment of the bias voltage permits selection of an efficiency with which a selected portion of the RF signal is communicated to the IF outputs 307, 309. For example, if the strobe pulses 303 have relative long turn-on times, the sampling diodes can require correspondingly long times to reach bias conditions in which the RF signal is communicated or communicated efficiently to the IF outputs 307, 309. Applying a bias voltage can reduce these times. Alternatively, a bias voltage can be configured to prevent or reduce the communication of RF signal portions of predetermined amplitudes to the IF outputs 307, 309.

In representative embodiments, the RF signal is a periodic signal that repeats at a signal repetition rate and the LO signal is arranged so that the strobe pulses 303 are applied at a strobe repetition rate that can be varied to be at frequencies at or near the signal repetition rate or an integer multiple thereof. RF signal and strobe pulse relative frequency and phase are communicated on a timing bus 321. With substantially equal signal and strobe repetition rates, the RF signal is repeatedly sampled at times at which the RF signal has a similar waveform and an averaged sample signal value can be acquired. Adjusting the repetition rates permits a so-called equivalent time sampled representation of the RF signal to be acquired.

With reference to FIG. 4A, a sampling circuit 400 is configured for the application of two strobe pulses to an input pad 440. The sampling circuit 400 includes strobe waveguides 406, 416 that comprise respective conductors 407, 408 and 417, 418 and respective inputs 409, 410 and 419, 420. IF waveguides 426, 436 comprise respective conductors 427, 428 and 437, 438 and respective inputs 429, 430 and 439, 440. Sampling diodes 445 similar to the sampling diodes 142, 144 of FIG. 1 connect the conductors 427, 428, 439, 438 to the input pad 440 and diodes 447 connect corresponding conductors of the strobe waveguides 405, 416 to the IF waveguides 426, 436, respectively. A ground plane conductor 411 is situated at a perimeter of a substrate 401 on which the circuit 400 is defined.

Conductors 407 408 and 417, 418 of the strobe waveguides 406, 416, respectively, are interconnected with diodes 452, 453, 454 to form respective NLTLs 402, 404. A surface of the substrate 401 opposite a surface 403 on which the sampling circuit 400 is defined is also provided with a ground plane conductor that is connected to the conductor 411, but is not shown in FIG. 4.

The sampling circuit 400 can be operated in a fashion similar to that of the sampling circuit 100. The sampling circuit 400 is configured to provide two strobe pulses (via the NLTLs 402, 404) and to communicate corresponding sampled signals from the input pad 440 to corresponding IF waveguides 426, 427. Thus, an RF signal can be sampled at a higher sampling rate, or acquired by one or more signal processors.

FIG. 4B is a schematic diagram of a portion of a sampling circuit 450 that includes an NLTL 492 and an IF waveguide 494. The NLTL 492 includes diodes 495 and a strobe waveguide 496 defined by conductors 458, 460. For convenience, FIG. 4B shows illustrates all the diodes 494 of the NLTL 492 similarly although the diodes 494 generally differ in size as a function of position along a waveguide axis 462. The IF waveguide 494 includes conductors 472, 474 and diodes 464 are situated to electrically connect the NLTL 492 to the IF waveguide 494. Sampling diodes 466 electrically connect the IF waveguide 494 to an input pad 470. As shown in FIG. 4B, the strobe waveguide 496 and the IF waveguide 494 are situated along the waveguide axis 462, but need not be so situated. In addition, ground plane conductors and other features similar to those of FIG. 1 and FIG. 4A are not shown in FIG. 4B.

The sampling circuits of FIG. 1 and FIGS. 4A-4B include one or more strobe waveguides and one or more intermediate frequency waveguides. Placement of these waveguides symmetrically, or approximately symmetrically, about a common axis, facilitates distinguishing a local oscillator signal (or portions of strobe pulses produced from the local oscillator signal) and samples of a signal input. For example, the sampling circuit 100 is configured so that the local oscillator signal propagates as an odd mode on the strobe waveguide 106 and samples of the signal input propagate as an even mode on the intermediate frequency waveguide 138. Portions of the local oscillator signal or strobe pulses coupled to the intermediate frequency waveguide tend to propagate as an odd mode so that signal samples can be distinguished from the local oscillator signal by waveguide mode selection or other method. Placement of the strobe waveguide and the IF waveguide need not be completely symmetric and a lack of symmetry generally only increases the extent to which the local oscillator signal and the signal samples appear in a common waveguide mode on the IF waveguide. Thus, in such arrangements, mode selection does not completely separate signal samples and the local oscillator signal.

The representative sampling circuits of FIGS. 1, 4A-4B are suitable for providing samples of input signals obtained during time intervals of less than a few picoseconds. However, in order to obtain samples that accurately correspond to an input electrical signal, the input electrical signal must be delivered to the sampling circuit without introducing signal artifacts. In addition, if the input signal to be sampled is to be communicated to additional measurement apparatus or to operational equipment for analysis or use, then delivery of the input signal to the sampling system should not introduce signal artifacts or otherwise degrade the signal. As used herein, sampling systems that obtain signal samples are deliver the input signal to an output are referred to as "feed-through samplers." For feed-through samplers, preserving the integrity of the input signal can be a significant consideration. In representative embodiments, an electrical signal propagating on a coaxial cable is delivered to a coaxial airline and a conductor of the airline communicates the electrical signal to a sampling circuit. The conductor also communicates the electrical signal to an output connector for delivery of the electrical signal back to a coaxial cable or other transmission line or waveguide.

With reference to FIG. 5A, an input signal propagating in a coaxial cable or other transmission line that terminates in a connector (not shown) is directed to a coax-to-airline transition ("transition") 500 that includes connector adapters 502, 504. The connector adapters are configured to receive or deliver electrical signals to/from cables, waveguides, or other transmission media that terminate in connectors such as a SMA, K, or other types of connectors. The connector adapters 502, 504 are situated on a housing 506 that is generally electrically conductive and that is electrical connected to a ground connection of the connector adapters. The housing 506 defines a bore 508 that is situated along an axis 509. Alternatively, the housing 506 can be nonconductive but include a cavity having a conductive surface formed by, for example, thin metallic layers. A conductor 510 is situated in the bore 508 and extends in a direction that is substantially parallel to the axis 509. In a representative example, a cross-section of the bore 508 is circular and has a radius of about 0.283 mm, the conductor 510 is situated along the axis 509, and diameter of the conductor 510 is approximately 0.241 mm. Radii of the bore 508 and the conductor 510 are typically selected to produce a waveguide having an impedance corresponding to an impedance of the waveguide or cable corresponding to one or both of the connector adapters 502, 504. In the representative example described here, the radii are selected to that $R_{bore}/R_{conductor}$ is approximately 2.3 to provide a waveguide having an impedance of about 50Ω. For other waveguide configurations, or to form a waveguide having a different impedance, different relationships between the dimensions of the bore 508 and the conductor 510 can be used and contributions to waveguide impedance from a dielectric that fills all or part of the volume defined by the bore 508 can be included. The bore 508 can have various cross-sectional shapes, including, for example, rectangular, circular, and elliptical.

The conductor 510 is configured to provide communication of an electrical transient or other electrical signal received at either of the connector adapters 502, 504 to an interconnect 512. The interconnect 512 can be a bond wire or other flexible electrical connection that is situated to contact the conductor 510. Typically a first surface 512a (or other portion) of the interconnect 512 presses against the conductor 510 and a second surface 512b (or other portion) connects to a bond pad 516 on a substrate 518. The bond pad 516 is situated on a substrate such as GaAs, silicon, or other material. Semiconductor substrates can include active electrical components or transmission lines for processing an electrical signal or delivering an electrical signal to a destination. In a representative embodiment, the interconnect 512 is a metallic puck formed by one or more bond balls that are attached to the bond pad 516.

In representative embodiments, the substrate 518 includes a sampling circuit such as those of FIGS. 1 and 4A-4B, and the interconnect 512 is corresponds to the conductive pad 140 of FIG. 1. In such embodiments, the interconnect 512 includes one or more conductive balls formed by wirebonding to the substrate 518 and removing the associated wires.

A conductive shield 520 is electrically connected to the substrate 516 and to the housing 506 to reduce penetration of propagating electric fields into the substrate 516. Generally the shield 520 is electrically connected to ground plane conductors defined on the substrate 516. With reference to the sampling circuit 100 of FIG. 1, the shield can be electrically connected to the conductor 111. The shield 520 can be a flexible electrically conductive sheet material such as a thin metallic sheet, or can be a braided conductive material or a wire mesh such as a gold mesh. A braided conductive material is convenient because such a material can be formed and wired bonded or soldered to the substrate 516 and configured so that the interconnect 512 extends through an aperture 571 in the shield 516 to contact the conductor 510.

The conductor 510 is supported in the housing 506 with washers 522, 524 that are typically made of a low dielectric constant material that exhibits low electrical loss in a selected frequency range. For a frequency range of from 0 Hz to about 300 GHz, a suitable material is a polytetrafluoroethlyene (TEFLON) that can be reinforced with randomly arranged glass fibers or a glass fiber mesh. As shown in FIG. 5A, the conductor 510 extends through the washers 522, 524 to center conductor pins 526, 528 of connector adapters 502, 504, respectively. The pins 526, 528 define bores 530, 532 that receive and electrically contact ends of the conductor 510. Pressure of the conductor 510 against the bores 530, 532 retains the conductor 510 in the bores 530, 532. Such pressure can be provided by, for example, forming slits in the pins 526, 528 so that ends of the pins can be configured to retain the conductor 510. In alternative embodiments, the conductor 510 can be attached with solder, an electrically conductive adhesive, or in some other manner. Beads 534, 536 receive the pins 526, 528, respectively and retain the pins 526, 528 in respective connector adapters. The beads 534, 536 are configured to secure the pins 526, 528 so that the connection of a cable or transmission line to either or both of the pins 526, 528 does not terminate the electrical connection of the conductor 510 to the interconnect 512. With reference to FIG. 5C, a recess 519 such as a groove is provided in the housing 506 for retention of the substrate 518. As situated in the recess 519, the substrate 518 extends into the bore 508 and the shield 520 extends around the substrate 518 to the housing 506.

The housing 506 of the transition 500 can be variously configured. A representative example is shown in FIGS. 6A-6E. In this example, the housing 506 is defined by a substrate portion 602 and a lid portion 604. The substrate portion 602 includes recesses 606, 608 configured to retain a sampling circuit or other substrate and a recess 610 that defines a portion of an airline bore such as the bore 508 of FIG. 5A. A recess 612 is provided for access to the substrate retained in the recesses 606, 608. The lid portion 604 defines a recess 614 that serves as a portion of an airline bore. In addition, the substrate portion 602 and the lid portion 604 are provided with one or more mounting holes such as the holes 616 that can be tapped or otherwise configured for attachment of the lid portion 604 to the substrate portion 602. As shown in FIGS. 6A-6E, the holes are configured for use with screws, but other fasteners or fastening methods can be used.

Figure 7:
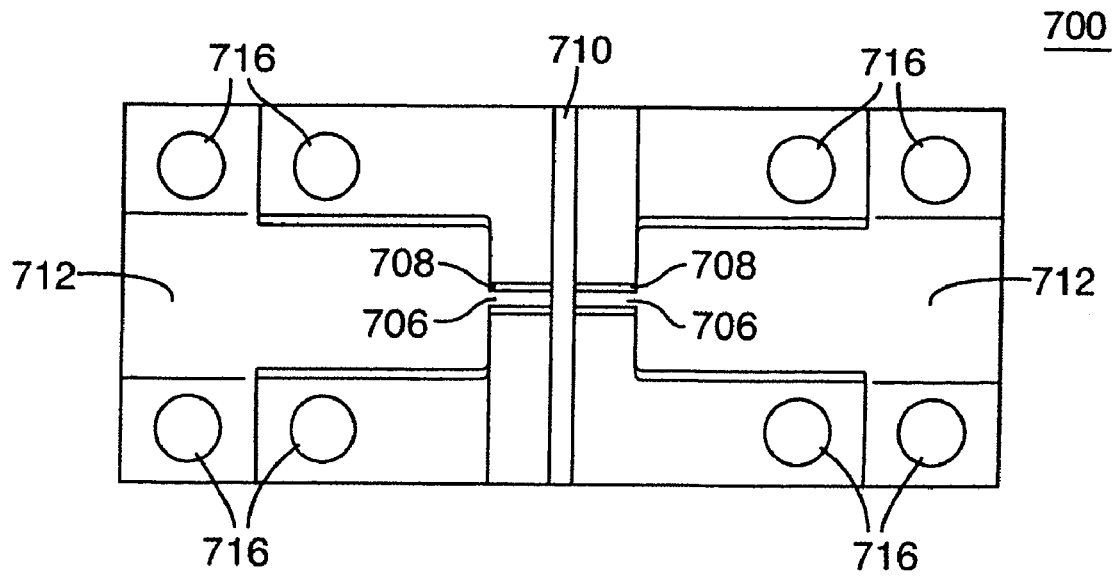
FIG. 7 is a plan view of a substrate portion of a housing for a coaxial airline to substrate transition configured for retaining sampling circuits such as those of FIGS. 4A-4B.

A substrate portion 700 of a housing configured to retain sampling circuits such as those shown in FIGS. 4A-4B is illustrated in FIG. 7. The substrate portion 700 includes recesses 708, 710 configured to retain the sampling circuit and a recess 710 that defines a portion of an airline bore. Recesses 712 are provided for access to the sampling circuit and mounting holes 716 are also provided. The substrate portion 700 permits access to opposing ends of a sampling circuit. As shown in FIG. 7, the substrate portion 700 is configured for a sampling circuit that extends along an axis 720, but sampling circuits can be provided that do not extend along a single axis, but along two or more intersecting axes.

In additional embodiments, a transition is configured as a connector adapter. In such embodiments, the connector adapters 502, 504 correspond to different connector types or male or female connector adapters of the same connector type. In addition, connector adapters suitable for various cable types and waveguides can be provided to form a coax-to-waveguide transition. A transition provided with different connector adapters then can serve to adapt different connector types.

Exemplary transitions described above include an airline having a bore that is penetrated by an interconnect such as a conductive puck. In additional examples, the airline includes a bore that is filled or partially filled with a dielectric, and the dielectric is provided with apertures that permit the interconnect to access an airline conductor.

The embodiments described above are examples only and it will be apparent to those skilled in the art that these embodiments can be modified in arrangement and detail without departing from the principles and scope of the invention. For example, shocklines or NLTLs can be configured to produce strobe pulses having fast rise times, fall times, or both. The invention is not to be limited by the described embodiments and we claim all that is encompassed by the appended claims.

We claim:

1. A sampling circuit, comprising;

a substrate;

a first sampling diode and a second sampling diode defined on the substrate and in electrical communication with a signal input;

a strobe waveguide, defined on the substrate, that includes a first conductor and a second conductor configured to deliver corresponding strobe pulses of opposite polarity to the first sampling diode and the second sampling diode;

an intermediate frequency (IF) waveguide, defined on the substrate, and that includes a first conductor and a second conductor that are in electrical communication with the first sampling diode and the second sampling diode, respectively, and configured so that signal samples delivered to the first and second conductors by the first sampling diode and the second sampling diode are of the same polarity and strobe portions delivered to the first conductor and second conductor are of opposing polarity;

varactors configured with the strobe waveguide to form a nonlinear transmission line (NLTL); and respective diodes that electrically connect the first conductor of the IF waveguide and the second conductor of the IF waveguide to the first conductor of the strobe waveguide and the second conductor of the strobe waveguide, respectively.

2. A sampling circuit, comprising;
a substrate;
a first sampling diode and a second sampling diode defined on the substrate and in electrical communication with a signal input;
a strobe waveguide, defined on the substrate, that includes a first conductor and a second conductor configured to deliver corresponding strobe pulses of opposite polarity to the first sampling diode and the second sampling diode; and
an intermediate frequency (IF) waveguide, defined on the substrate, and that includes a first conductor and a second conductor that are in electrical communication with the first sampling diode and the second sampling diode, respectively, and configured so that signal samples delivered to the first and second conductors by the first sampling diode and the second sampling diode are of the same polarity and strobe portions delivered to the first conductor and second conductor are of opposing polarity, wherein the conductors of the strobe waveguide and the conductors of the IF waveguide extend along a common axis.

3. The sampling circuit of claim 2, wherein the conductors of the strobe waveguide are situated symmetrically about the common axis.

4. The sampling circuit of claim 3, wherein the conductors of the intermediate frequency waveguide are situated symmetrically about the common axis.

5. The sampling circuit of claim 4, wherein the conductors of the strobe waveguide are closer to the common axis than the conductors of the intermediate frequency waveguide.

6. A sampling circuit, comprising;
a substrate;
a first sampling diode and a second sampling diode defined on the substrate and in electrical communication with a signal input;
a strobe waveguide, defined on the substrate, that includes a first conductor and a second conductor, configured to deliver corresponding strobe pulses of opposite polarity to the first sampling diode and the second sampling diode;
an intermediate frequency (IF) waveguide, defined on the substrate, and that includes a first conductor and a second conductor that are in electrical communication with the first sampling diode and the second sampling diode, respectively, and configured so that signal samples delivered to the first and second conductors by the first sampling diode and the second sampling diode are of the same polarity and strobe portions delivered to the first conductor and second conductor are of opposing polarity; and
varactors configured with the strobe waveguide to form a nonlinear transmission line (NLTL), wherein the strobe waveguide and the IF waveguide are coplanar waveguides that are situated along a common axis.

7. The sampling circuit of claim 6, wherein the IF waveguide and the strobe waveguide are situated symmetrically about a common axis.

8. The sampling circuit of claim 7, wherein the substrate is GaAs.

9. A sampling circuit, comprising:
an input configured to receive an electrical signal;
a strobe waveguide situated along an axis;
an intermediate frequency waveguide situated along the axis; and
two sampling diodes that are in electrical communication with the strobe waveguide and the intermediate frequency waveguide and configured to direct samples of the electrical signal to the intermediate frequency waveguide in response to a strobe signal propagating on the strobe waveguide, wherein the strobe waveguide is configured to provide a strobe signal that propagates as an odd waveguide mode on the strobe waveguide and the sampling diodes are configured to direct samples of the electrical signal to the intermediate frequency waveguide for propagation as an even mode of the intermediate frequency waveguide.

10. The sampling circuit of claim 9 wherein the strobe waveguide and the intermediate frequency waveguide are coplanar waveguides.

11. The sampling circuit of claim 9, further comprising a substrate on which the strobe waveguide, the intermediate frequency waveguide, and the sampling diodes are defined.

12. The sampling circuit of claim 9, further comprising a plurality of varactors that, in combination with the strobe waveguide, form a nonlinear transmission line.

13. A sampling circuit that delivers signal samples to a sample output, the sampling circuit comprising a strobe waveguide and an intermediate frequency waveguide configured so that a local oscillator signal propagates on the strobe waveguide in a waveguide mode different from a waveguide mode in which the signal samples propagate on the intermediate frequency waveguide, wherein the strobe waveguide and the intermediate frequency waveguide are approximately symmetrical with respect to an axis.

14. The sampling circuit of claim 13, wherein the local oscillator signal propagates as an odd mode on the strobe waveguide and the signal samples propagate as an even mode on the intermediate frequency waveguide.

15. A sampling circuit, comprising:
a GaAs substrate;
a coplanar strip strobe waveguide and a coplanar strip intermediate frequency waveguide that are situated symmetrically about a common axis on the GaAs substrate, wherein the strobe waveguide is situated between the intermediate frequency waveguide and the common axis;
a plurality of varactors configured with the strobe waveguide to form a nonlinear transmission line (NLTL);
capacitive couplers that connect corresponding conductors of the strobe waveguide and the intermediate frequency waveguide;
a signal input that includes a conductive puck; and
two sampling diodes situated to connect respective conductors of the intermediate frequency waveguide the signal input.

16. A sampling system, comprising:
a sampling circuit as recited in claim 15;
an airline that includes a central conductor in electrical communication with the conductive puck and an input and output connector adapters for connection to corresponding coaxial cables, the airline configured to have an impedance corresponding to an impedance of the coaxial cables;
a local oscillator source that provides an electrical signal to the nonlinear transmission line and, that in combination with the NLTL, produces sampling pulses of opposite polarity; and
a signal processor in communication with the intermediate frequency waveguide that receives a signal sample obtained from a signal applied to the airline, wherein the signal sample received from a first conductor of the intermediate frequency waveguide is combined with a strobe sample of a first polarity and the signal sample received from a second conductor of the intermediate frequency waveguide is combined with a strobe sample of a second polarity, opposite the first polarity.

\* \* \* \* \*